United States Patent
Wharton et al.

(10) Patent No.: US 6,549,405 B2
(45) Date of Patent: Apr. 15, 2003

(54) ELECTRONIC CHASSIS

(75) Inventors: Mark J. Wharton, Pennsylvania Furnace, PA (US); Christopher S. Hackman, Snow Shoe, PA (US)

(73) Assignee: Vertex Electronic Products, Inc., State College, PA (US)

( * ) Notice: Subject to any disclaimer, the term of this patent is extended or adjusted under 35 U.S.C. 154(b) by 65 days.

(21) Appl. No.: 09/876,644

(22) Filed: Jun. 7, 2001

(65) Prior Publication Data

US 2001/0050841 A1 Dec. 13, 2001

Related U.S. Application Data

(60) Provisional application No. 60/210,875, filed on Jun. 9, 2000.

(51) Int. Cl.⁷ ................................................ H05K 7/20
(52) U.S. Cl. ........................ 361/695; 361/690; 361/692; 361/687; 165/80.3; 165/121; 165/106.33; 454/184
(58) Field of Search ................................. 361/680, 683, 361/684–687, 690–697, 725–727, 736, 794, 797, 802; 312/223.1, 223.2, 204, 298, 334.4, 334.8, 136, 236, 336.8; 364/708.1; 454/184; 165/80.3, 121, 126, 106.33; 174/15.1, 16.3, 16.1; 62/259.2, 406, 407, 419

(56) References Cited

U.S. PATENT DOCUMENTS

| | | | | |
|---|---|---|---|---|
| 5,119,270 A | * | 6/1992 | Bolton et al. ............... | 361/687 |
| 5,490,723 A | * | 2/1996 | Driscoll et al. ......... | 312/334.28 |
| 5,949,646 A | * | 9/1999 | Lee et al. .................... | 361/695 |
| 6,052,281 A | * | 4/2000 | Hardt et al. ................ | 361/690 |
| 6,058,011 A | * | 5/2000 | Hardt et al. ................ | 361/694 |
| 6,421,215 B1 | * | 7/2002 | Bushue ...................... | 361/93.1 |

\* cited by examiner

*Primary Examiner*—Darren Schuberg
*Assistant Examiner*—Michael Datskovsky
(74) *Attorney, Agent, or Firm*—John J. Elnitski, Jr.

(57) ABSTRACT

An improved electronic chassis for housing and cooling electronic modules. The electronic chassis includes a top and bottom which are connected by two sides, a front and a rear. The chassis includes an upper section near the top and within the top, bottom, front, rear and sides of the chassis, and the chassis includes a lower section near the bottom and within the top, bottom, front, rear and sides of the chassis. There are at least two electronic modules to be mounted in the chassis. There are at least two intake fans mounted in the upper section of the chassis at the back of the chassis. The intake fans are for intake of cooling air from outside the rear of the chassis. There are at least two bays mounted in the upper section of the chassis in front of the intake fans and near the front of the chassis. The bays are for receiving the electronic modules, where each of the bays have an open front and an open rear. The front of the bays are open to provide access to receive the electronic modules. The open rear provides an entrance to receive the cooling air blown from the intake fans into the bays such that the cooling air blows over the electronic modules and out the front of the bays. There are at least two exhaust fans in the lower section of the chassis ported outside the chassis. The exhaust fans for pulling the cooling air out of the chassis after the cooling air passes the electronic modules and out the fronts of the bays.

20 Claims, 9 Drawing Sheets

ELECTRONIC CHASSIS

This application claims priority to U.S. Provisional Application No. 60/210,875, filed Jun. 9, 2000 and hereby incorporates it by reference.

BACKGROUND

The electronic industry is constantly trying to reduce the size of electronic systems. Electronic chassises, which hold a number of electronics, are one of the most difficult to reduce in size, due to necessary cooling required for electronics. One example of such an electronic chassis is the type which houses a solid state power amplifier. The solid state power amplifier typically is made up of a series of plug in RF modules in the electronic chassis for redundancy. The RF modules plug into open bays in the electronic chassis. The RF modules are a combination of an electronics module and heatsinks. The heatsinks are used to cool the electronics module, but are usually very large and heavy. The RF modules are cooled by one cooling fan which intakes cooler air from outside the electronic chassis and forces the cooler air over the heatsinks to cool the heatsinks. The problems with such a system are as follows.

Even though the RF modules can be reduced in size, the amount of heat that the RF modules generate can not be reduced and large heatsinks are still required. Therefore, the electronic chassis can not be reduced in size due to the large heatsinks for the RF modules. FIG. 1 shows a typical heatsink configuration of an electronics module 10, a top heatsink 12 and a bottom heatsink 14. Another problem lies in that if the cooling fan fails, then all the RF modules in the electronic chassis are subject to failure, thereby reducing the effectiveness of having more than one RF module for redundancy. What is needed are improvements to allow the reduction in size of an electronic chassis, while maintaining redundancy and cooling requirements.

It is an object of the present invention to provide an improved electronics chassis which has a redundant and improved cooling system.

SUMMARY OF THE INVENTION

An improved electronic chassis for housing and cooling electronic modules. The electronic chassis includes a top and bottom which are connected by two sides, a front and a rear. The chassis includes an upper section near the top and within the top, bottom, front, rear and sides of the chassis, and the chassis includes a lower section near the bottom and within the top, bottom, front, rear and sides of the chassis. There are at least two electronic modules to be mounted in the chassis. There are at least two intake fans mounted in the upper section of the chassis at the back of the chassis. The intake fans are for intake of cooling air from outside the rear of the chassis. There are at least two bays mounted in the upper section of the chassis in front of the intake fans and near the front of the chassis. The bays are for receiving the electronic modules, where each of the bays have an open front and an open rear. The front of the bays are open to provide access to receive the electronic modules. The open rear provides an entrance to receive the cooling air blown from the intake fans into the bays such that the cooling air blows over the electronic modules and out the front of the bays. There are at least two exhaust fans in the lower section of the chassis ported outside the chassis. The exhaust fans for pulling the cooling air out of the chassis after the cooling air passes the electronic modules and out the fronts of the bays.

DETAILED DESCRIPTION

The present invention includes three improvements to reduce the size of the electronic chassis. These improvement can be implemented separately or all together in an electronic chassis. The example of a solid state power amplifier will be used as an example of an electronic system having the improvements of the present invention. The three improvements of the present invention for the electronic chassis are a high efficiency heatsink, a distributed cooling system and a swing down door system. The example of the solid state power amplifier is typically a series of RF modules plugged into open bays in the electronic chassis. These RF modules are typically cooled by one cooling fan which intakes cooler air from outside the electronic chassis and directs the cooler air over the heatsinks.

Figure 1:
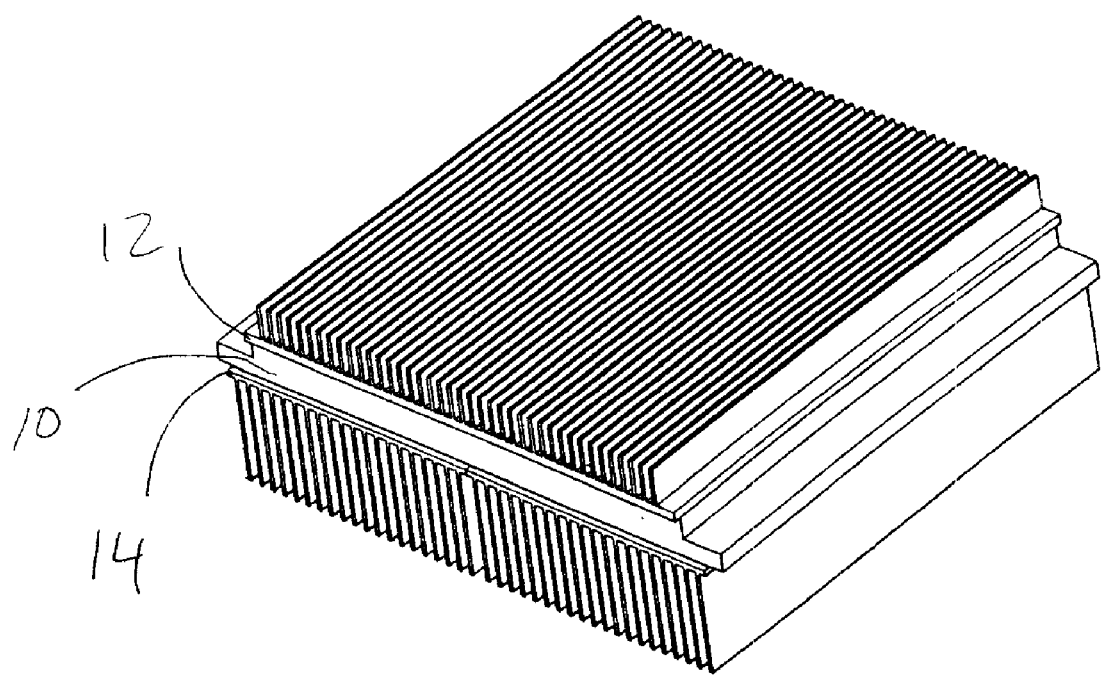
FIG. 1 is perspective view of an electronic module.
Figure 2:
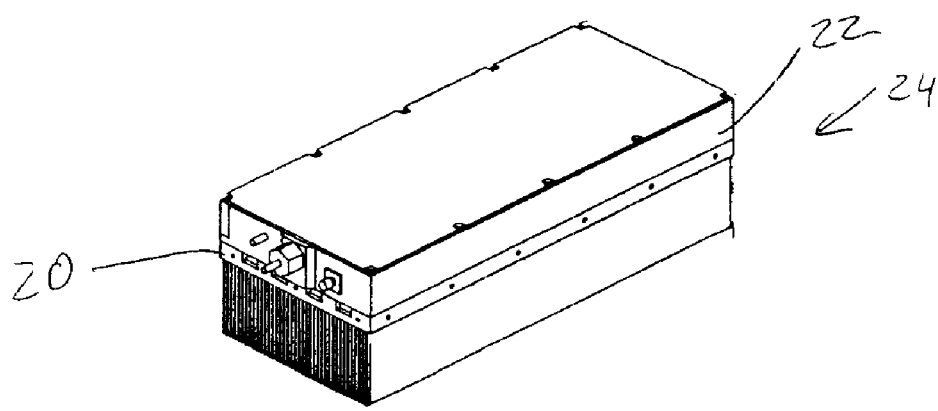
FIG. 2 is perspective view of another electronic module.
Figure 3:
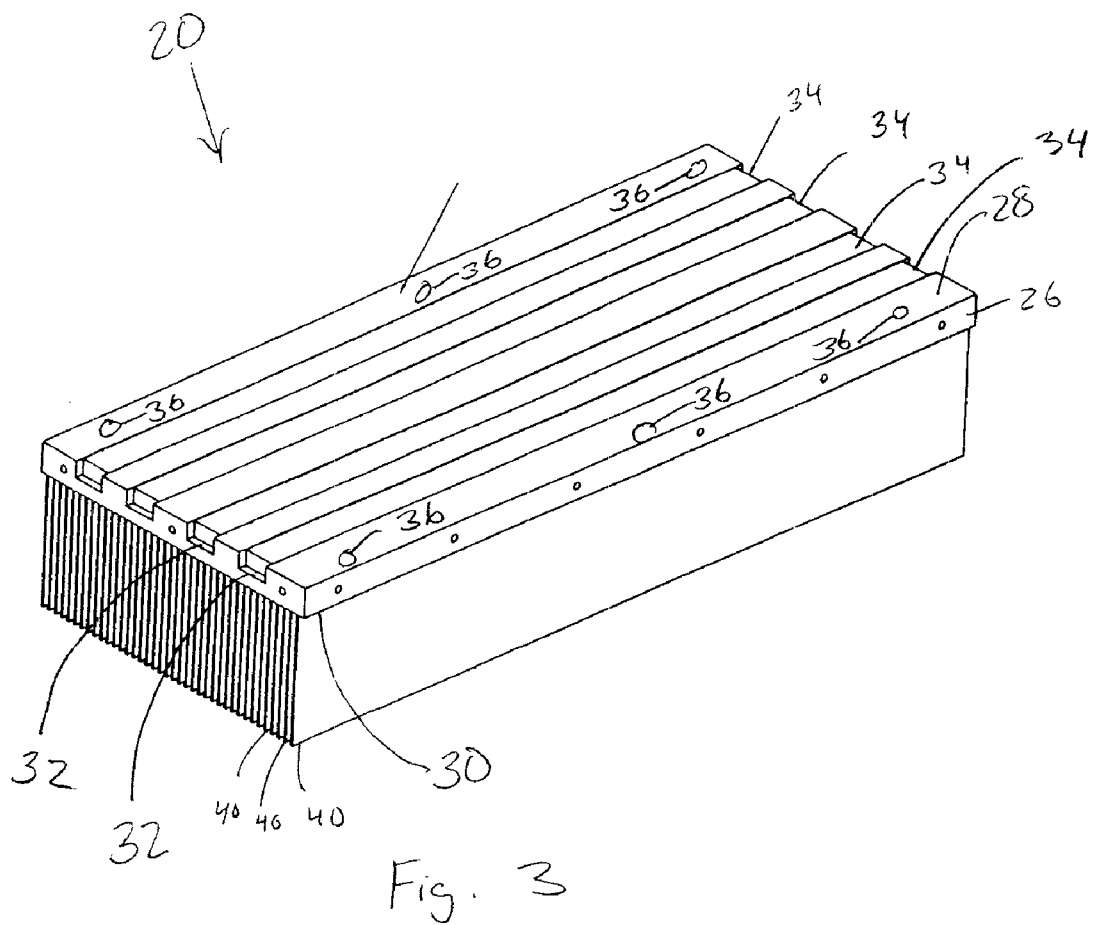
FIG. 3 is perspective view of a heat sink with heat pipes.
Figure 4:
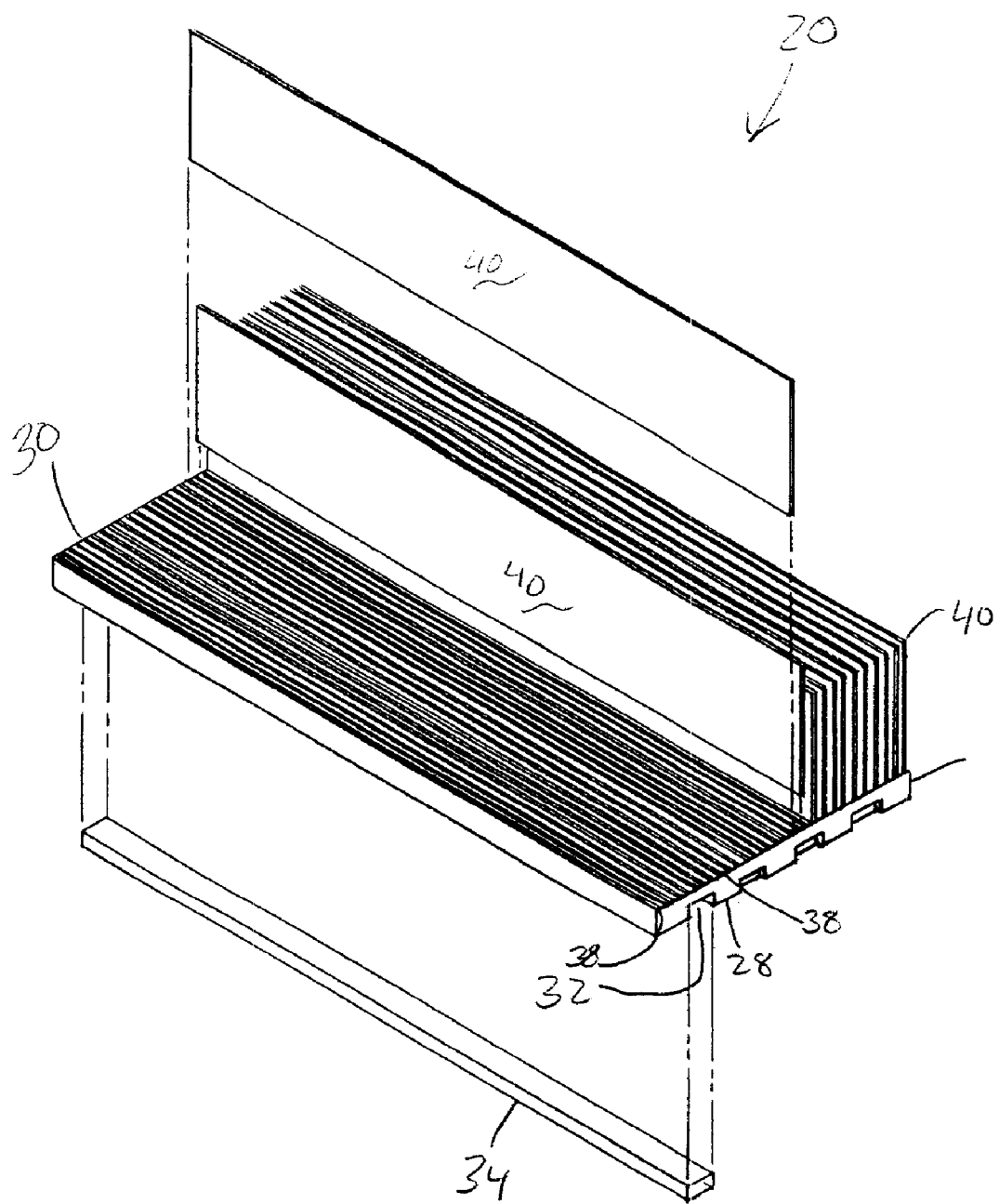
FIG. 4 is exploded perspective view of the heat sink with heat pipes of FIG. 3.

The high efficiency heatsink 20 is shown in FIG. 2 attached to electronics module 22 to form a smaller RF module 24. FIGS. 3–4 shows the high efficiency heatsink 20 without the electronics module 22. The high efficiency heatsink 20 includes an aluminum base plate 26 having a top 28 and a bottom 30. The top 28 of the heatsink 20 includes channels 32 milled to receive copper heat pipes 34. The copper heat pipes 34 are attached in the channels 32 using a heat resistant epoxy. The copper heat pipes 34 are sealed self contained units. The copper heat pipes 34 include an internal working fluid and a condensation wick. The copper heat pipes 34 are passive heat transfer devices with a very high thermal conductivity. Instead of relying on a thick and heavy aluminum baseplate to spread the heat, the conductivity of the heat pipes 34 conducts the heat away from the electronics module 22. This allows the reduction in thickness and weight of the aluminum baseplate. The top 28 of the heatsink 20 also includes screw holes 36 so that the electronics module 22 can be screwed to the top 28 of the heatsink 20. As shown in FIG. 4, the bottom 30 of the of the heatsink 20 is milled with fin channels 38 to receive a high density of fins 40. The fins 40 are epoxyed into the fin channel 38 using a heat resistant epoxy. The high density of fins 40 allows the reduction in total required area of a heatsink for cooling. The above described high efficiency heatsink 20 allows the size of a heatsink to be reduced, yet meet the cooling requirements of the electronics module 22.

Figure 5:
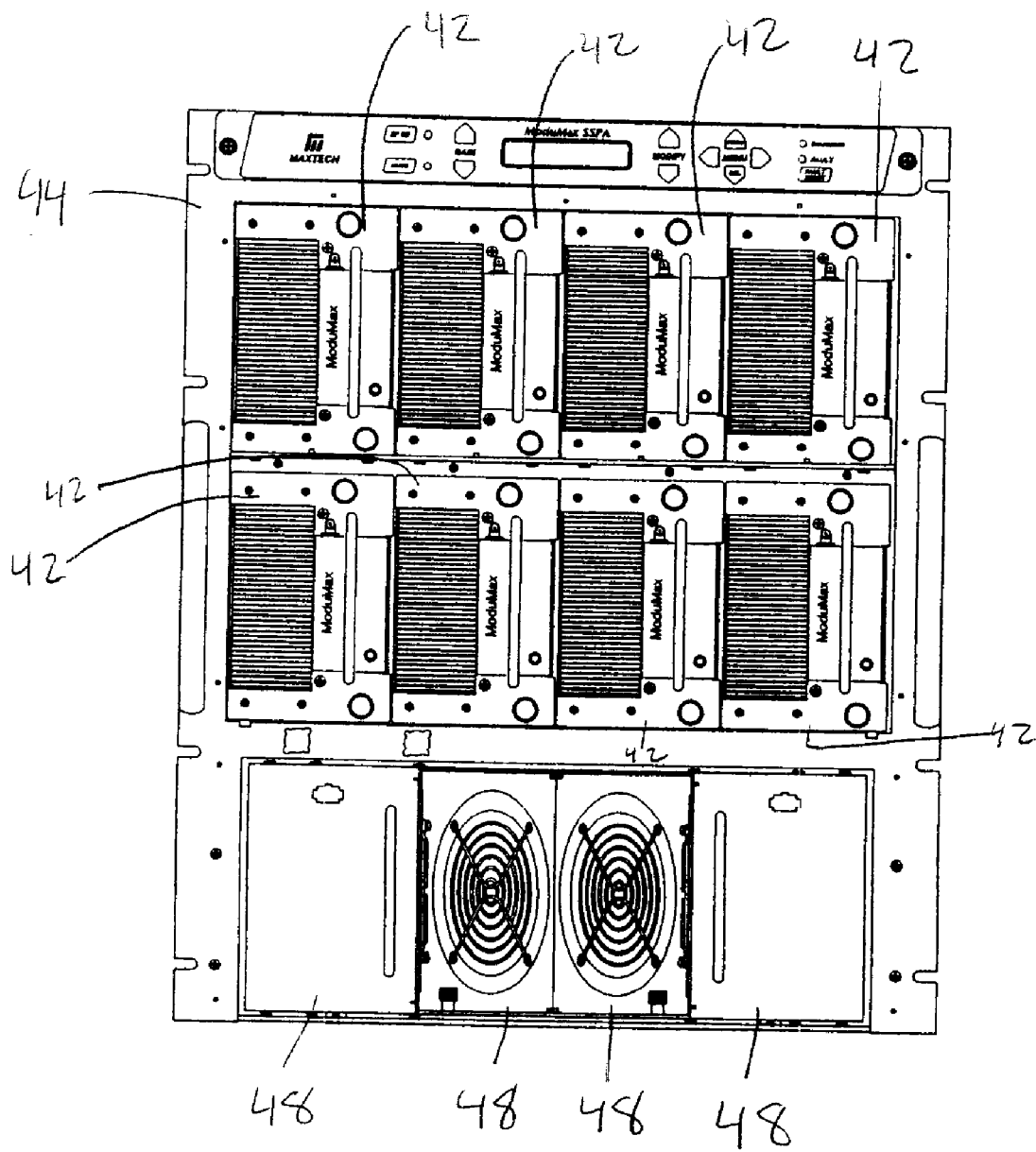
FIG. 5 is a front view of an improved electronic chassis according to the present invention.
Figure 6:
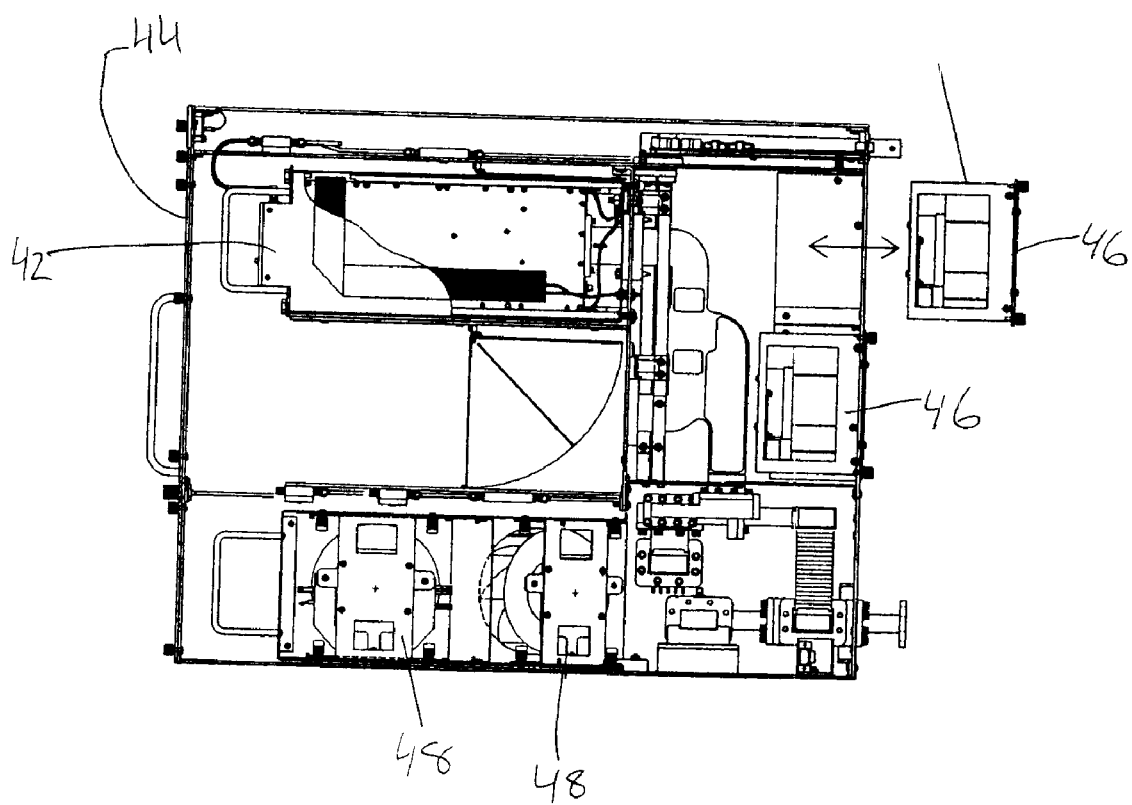
FIG. 6 is a side cut away view of an improved electronic chassis according to the present invention.
Figure 7:
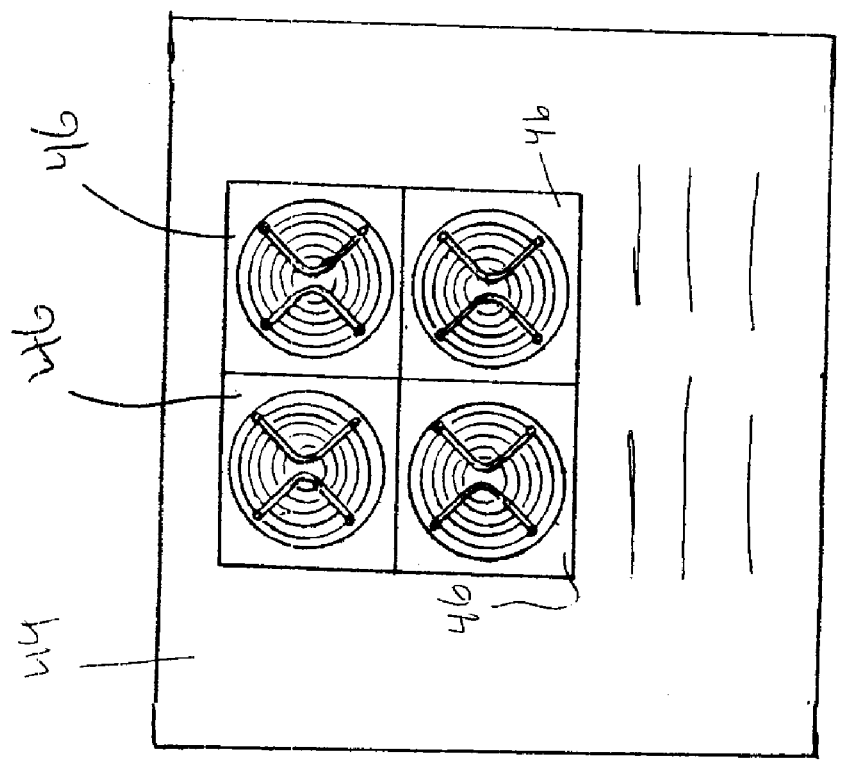
FIG. 7 is a rear view of an improved electronic chassis according to the present invention.
Figure 8:
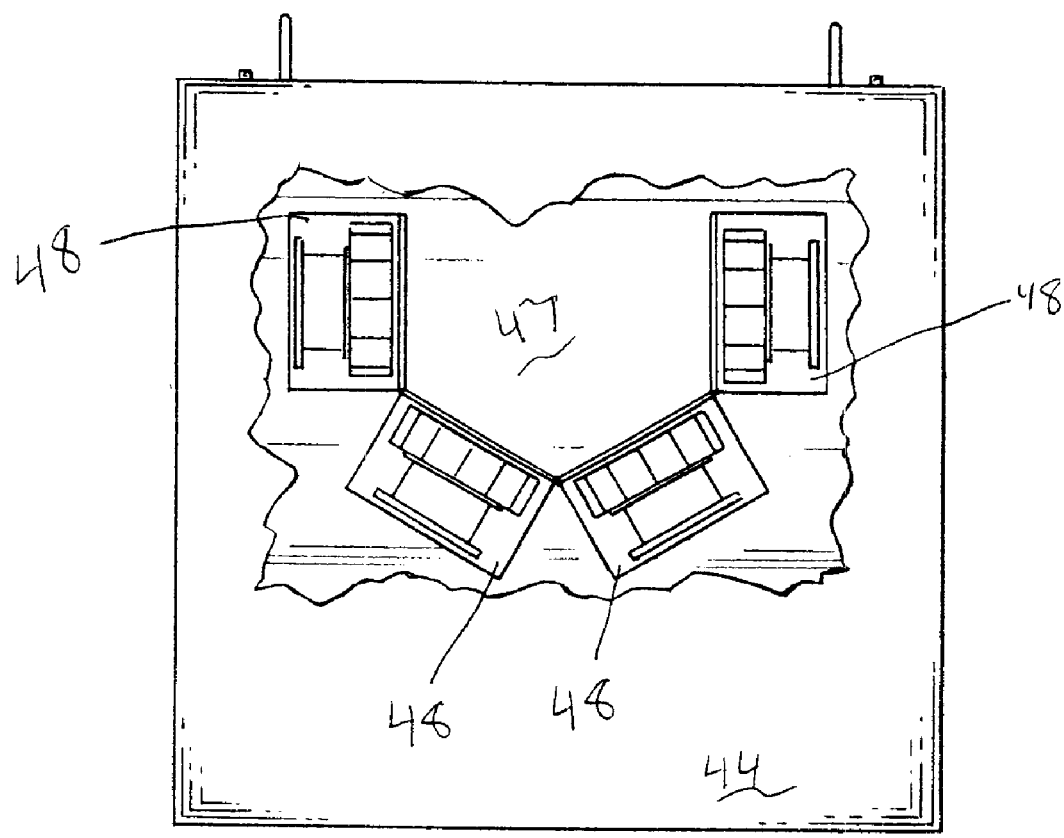
FIG. 8 is a bottom cut away view of an improved electronic chassis according to the present invention.

The distributed cooling system is shown in FIGS. 5–8 for cooling RF modules 42. Instead of using one large blower to cool the RF modules 42 in the electronic chassis 44, eight fans are used to force air over the RF modules 42. FIG. 5 shows a front view of the electronic chassis 44, FIG. 6 shows a side view of the electronic chassis 44, FIG. 7 shows a rear view of the electronic chassis 44, and FIG. 8 shows a bottom view of the electronic chassis 44. Four of the fans are intake fans 46 positioned behind the RF modules 42 shown in FIGS. 5–8 and four of the fans are exhaust fans 48 positioned below the RF modules 42. The intake fans 46 pull cooler air from outside of the electronic chassis 44 into the back of the electronic chassis 44 and force the air past the RF modules 42. The air blows past the RF modules 42 and is pulled downward by the exhaust fans 48 from the front of the RF modules 42, whereby the exhaust fans 48 blow the air warmed by the RF modules 42 out the back of the chassis of the electronic chassis 44. The exhaust fans 48 are positioned in a U-shape to capture all of the warm air blown past the RF modules 42. The exhaust fans being in the U-shape forms a cooling air receiveing area 47 in the U-shape, which is a collecting area for the warm air. Failure of one fan only reduces the amount of airflow and does not result in failure of the whole cooling system, and therefore all of the RF modules 42.

Figure 9:
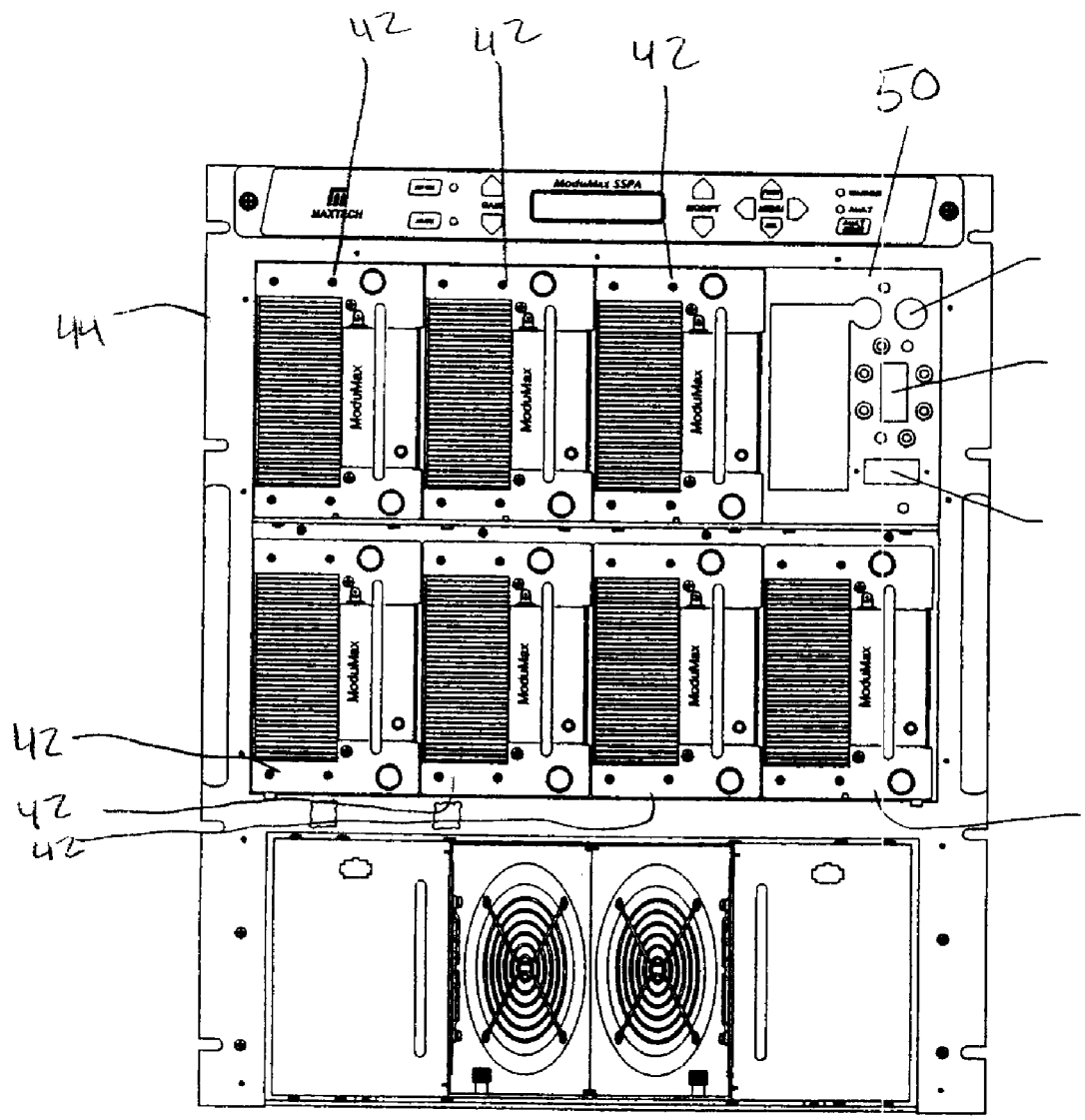
FIG. 9 is a front view of an improved electronic chassis according to the present invention with an electronic module removed.
Figure 10:
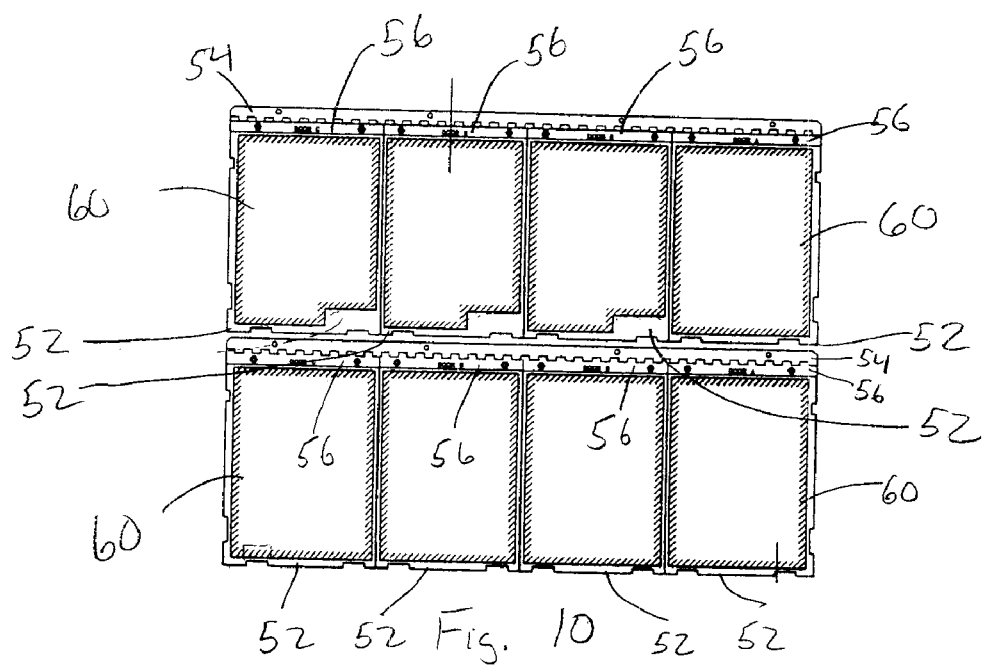
FIG. 10 is a rear view of swing down doors according to the present invention.
Figure 11:
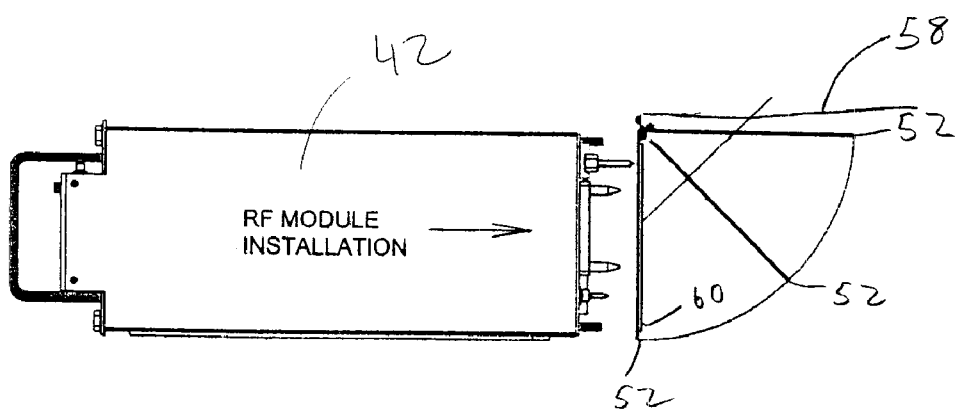
FIG. 11 is a side view of the swing down door operation according to the present invention.

The swing down door system is shown in FIGS. 9–11. FIG. 9 shows seven of the eight RF modules 42 plugged into the eight bays 50 shown in the electronic chassis 44. When a RF module 42 is removed, two undesirable things occur. The first is an empty bay 50 is left, which can impair the efficiency of the air cooling system. If left open, some of the cooling air can bypass the other RF modules 42 and escape out the open bay 50, thus causing some of the RF modules 42 to overheat. The second is that if there is an empty waveguide port to which the removed RF module 42 was plugged, the open waveguide port of an open bay 50 can radiate a small amount of RF energy. This could create a potential safety hazard for the service technician.

The swing-down door system includes a door 52 hinged at a top 54 of each bay 50 by hinge 56, in order to solve this problem. FIG. 10 shows a front view with all of the doors 52 closed due to empty bays 50. FIG. 11 shows a side view that illustrates the motion of the door 52 as the RF module 42 is plugged into one of the bays 50. As shown in FIG. 11, the door 52 swings inward and rearward against the top 58 of the bay 50 when the RF module 42 is plugged into the bay 50. When the RF module 42 is removed from the bay 50, the door 52 swings downward into a closed position, due to the weight of the door 52. The door 52 is then held closed by the airflow and blocks the cooling air from escaping. The door 52 also is coated with a microwave absorber 60 on a back surface of the doors 52. The microwave absorber 60 "soaks up" the small amount of RF radiation that is emitted from the open waveguide port, reducing the RF radiation to levels well below OSHA standards.

While embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention which is to be given the full breadth of the appended claims and any and all equivalents thereof.

We claim:

1. An improved electronic chassis, for housing and cooling electronic modules, comprising:

an electronic chassis to house electronic modules, said chassis including a top and bottom which are connected by two sides, a front and a rear, said chassis including an upper section near said top and within said top, bottom, front, rear and sides of said chassis, and said chassis including a lower section near said bottom and within said top, bottom, front, rear and sides of said chassis;

at least two electronic modules to be mounted in said chassis;

at least two intake fans mounted in said upper section of said chassis at said back of said chassis, said intake fans for intake of cooling air from outside said rear of said chassis;

at least two bays mounted in said upper section of said chassis in front of said intake fans and near said front of said chassis, said bays for receiving said electronic modules, each of said bays having an open front and an open rear, said front of said bays open to provide access to receive said electronic modules, said open rear providing an entrance to receive said cooling air blown from said intake fans into said bays such that said cooling air blows over said electronic modules and out said front of said bays; and at least two exhaust fans in said lower section of said chassis ported outside said chassis, said exhaust fans for pulling said cooling air out of said chassis after said cooling air passes said electronic modules and out said fronts of said bays.

2. The electronic chassis of claim 1, further including a door as part of said front of each of said bays, each of said doors hinged at a top of said front of said bays, said doors swinging inward said bays when each of said electronic modules is installed, and said doors sealing said bays when said bays are empty, thereby preventing flow of said cooling air through empty bays.

3. The electronic chassis of claim 2, wherein said doors swing upwards towards said top of said bays and close due to weight of said doors when said electronic modules are removed.

4. The electronic chassis of claim 2, wherein said bays include an electronics port to connect with said electronic modules, and wherein a rear of said doors, which faces inwards of said bays, includes a coating of material which absorbs radiation generated by said electronics port.

5. The electronic chassis of claim 2, wherein said doors swing upwards towards said top of said bays and close due to weight of said doors when said electronic modules are removed; wherein said bays include an electronics port to connect with said electronic modules, and wherein a rear of said doors, which faces inwards of said bays, includes a coating of material which absorbs radiation generated by said electronics port.

6. The electronic chassis of claim 2, wherein there is an intake fan for each of said bays; wherein each of said intake fan for each of said bays is aligned to blown cooler air from outside said chassis into said bays.

7. The electronic chassis of claim 2, wherein there are at least three exhaust fans which are oriented in a U-shape to form a cooling air receiving are to receive and exhaust said cooling air which has passed over said electronic modules.

8. The electronic chassis of claim 7, wherein there are at least four exhaut fans.

9. The electronic chassis of claim 7, wherein said exhaust fans are ported to said rear of said chassis on said lower section.

10. The electronic chassis of claim 5, wherein there is an intake fan for each of said bays; wherein each of said intake fan for each of said bays is aligned to blown cooler air from outside said chassis into said bays; wherein there are at least three exhaust fans which are oriented in a U-shape to form a cooling air receiving are to receive and exhaust said cooling air which has passed over said electronic modules.

11. The electronic chassis of claim 1, wherein there is an intake fan for each of said bays; wherein each of said intake fan for each of said bays is aligned to blown cooler air from outside said chassis into said bays.

12. The electronic chassis of claim 1, wherein there are at least three exhaust fans which are oriented in a U-shape to form a cooling air receiving are to receive and exhaust said cooling air which has passed over said electronic modules.

13. The electronic chassis of claim 12, wherein there are at least four exhaut fans.

14. The electronic chassis of claim 1, wherein said exhaust fans are ported to said rear of said chassis on said lower section.

15. The electronic chassis of claim 11, wherein there are at least three exhaust fans which are oriented in a U-shape to form a cooling air receiving are to receive and exhaust said cooling air which has passed over said electronic modules; and wherein said exhaust fans are ported to said rear of said chassis on said lower section.

16. The electronic chassis of claim 15, wherein said electronic modules include a heat sink.

17. The electronic chassis of claim 16, wherein said heat sink includes at least one heat pipe.

18. The electronic chassis of claim 5, wherein said electronic modules include a heat sink.

19. The electronic chassis of claim 18, wherein said heat sink includes at least one heat pipe.

20. The electronic chassis of claim 10, wherein said electronic modules include a heat sink and wherein said heat sink includes at least one heat pipe.

* * * * *